(12) United States Patent
Lim

(10) Patent No.: US 6,750,684 B2
(45) Date of Patent: Jun. 15, 2004

(54) INPUT CIRCUIT BUFFER SUPPORTING A LOW VOLTAGE INTERFACE AND A GENERAL LOW VOLTAGE TRANSISTOR LOGIC(LVVTL) INTERFACE

(75) Inventor: Kyu-Nam Lim, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/971,991

(22) Filed: Oct. 4, 2001

(65) Prior Publication Data

US 2002/0011877 A1 Jan. 31, 2002

Related U.S. Application Data

(63) Continuation of application No. 09/574,306, filed on May 19, 2000, now Pat. No. 6,452,429.

(30) Foreign Application Priority Data

May 19, 1999 (KR) ........................................ 1999-18095
Feb. 17, 2000 (KR) ........................................ 2000-7522

(51) Int. Cl.[7] ................................................ H03B 1/00
(52) U.S. Cl. ........................................ 327/108; 327/77
(58) Field of Search ............................ 327/108, 77, 78, 327/79, 81, 88, 89

(56) References Cited

U.S. PATENT DOCUMENTS

| | | | | |
|---|---|---|---|---|
| 3,991,380 A | * | 11/1976 | Pryor | 330/253 |
| 4,206,418 A | | 6/1980 | Dingwall | 330/253 |
| 5,602,495 A | | 2/1997 | Lou | 326/71 |
| 5,942,940 A | * | 8/1999 | Dreps et al. | 330/253 |
| 5,990,708 A | * | 11/1999 | Hu | 327/68 |
| 6,023,174 A | | 2/2000 | Kirsch | 326/34 |
| 6,118,318 A | * | 9/2000 | Fifield et al. | 326/27 |
| 6,144,232 A | * | 11/2000 | Yukawa et al. | 327/337 |
| 6,169,424 B1 | | 1/2001 | Kurd | 327/53 |
| 6,172,524 B1 | | 1/2001 | Cho | 326/70 |
| 6,181,172 B1 | * | 1/2001 | Callahan | 326/112 |

FOREIGN PATENT DOCUMENTS

| | | | |
|---|---|---|---|
| EP | 0146910 A2 | 3/1985 | |
| GB | 2343574 A | 10/2000 | |
| KR | 1997-008718 | 3/1997 | ............ G11C/7/00 |

OTHER PUBLICATIONS

M. Bazes, "Two Novel Fully Complementary Self–Biased CMOS Differential Amplifiers", IEEE Journal of SolidState Circuits, vol. 26, pp. 165–168, Feb. 1991.
Y. Takai, M. Fujita, et al. "A 250 Mbps/pin, 1Gb Double Data Rate SDRAM with a Bidirectional Delay and an Inter–bank shared Redundancy Scheme", ISSCC 99 Digest of Technical Papers, 418–419 & 487, Feb. 1999.

* cited by examiner

Primary Examiner—Linh M. Nguyen
(74) Attorney, Agent, or Firm—Harness, Dickey & Pierce, P.L.C.

(57) ABSTRACT

An input buffer circuit simultaneously supports a low voltage interface and a general low voltage transistor-transistor logic (LVTTL) interface and operates at high speed. In the input buffer circuit, a self bias voltage generated by a self biased differential amplification circuit is used not only for tracking a common mode input voltage in the differential amplification circuit but also for controlling the current of a current source and/or sink that controls the current used in the differential amplification circuit. Accordingly, the self bias voltage remains at a substantially uniform level. Therefore, the entire transconductance gain gm of the differential amplification circuit is substantially uniform regardless of the change in a reference voltage input to the differential amplification circuit. As a result, a low voltage interface characteristic is improved. The input buffer circuit further can further include a swing width control circuit that responds to an inverted signal generated from the output signal of the differential amplification circuit and prevents the voltage swing of the output signal from becoming excessively large. This reduces skew and thus improves the operating speed of the input buffer.

4 Claims, 8 Drawing Sheets

INPUT CIRCUIT BUFFER SUPPORTING A LOW VOLTAGE INTERFACE AND A GENERAL LOW VOLTAGE TRANSISTOR LOGIC(LVVTL) INTERFACE

CROSS REFERENCE TO RELATED APPLICATION

This application is a continuation of and claims priority from U.S. patent application Ser. No. 09/574,306, filed May 19, 2000, now U.S. Pat. No. 6,452,429 entitled, "High Speed Input Buffer Circuit for Low Voltage Interface" which claims priority from Korean Patent Application No. 1999-18095, filed May 19, 1999 and Korean Patent Application No. 2000-7522 filed Feb. 17, 2000.

BACKGROUND OF THE INVENTION

1. Field of the Invention

The present invention relates to a semiconductor memory device, and more particularly, to an input buffer circuit.

2. Description of the Related Art

Digital systems often use both transistor-transistor logic (TTL) semiconductor devices and complementary metal oxide semiconductor (CMOS) devices. Accordingly, such systems require interface circuits between the TTL semiconductor devices and CMOS devices. For example, input buffers (generally referred to as TTL-to-CMOS input buffers or TTL compatible input buffers) are often in CMOS devices for converting TTL input levels into CMOS levels.

As TTL semiconductor devices and CMOS devices operate at a low supply voltage of about 3.3 volts, input buffers in CMOS semiconductor devices convert low voltage transistor-transistor logic (LVTTL) input levels into CMOS levels. In an operation using a low supply voltage of 3.3 volts, an input low voltage (VIL) of 0 volts and an input high voltage (VIH) of 2.8 volts are for typical LVTTL input levels. In the worst case for the LVTTL input levels, the maximum VIL is about 0.8 volts, and the minimum VIH is about 2.0 volts. In general, the input buffers of the CMOS devices need to convert not only the LVTTL levels but also small swing transistor logic (SSTL) level into CMOS levels.

Recent developments of portable information equipment such as portable telephones, in which low voltage and power consumption are very important, demand input buffers that can support low voltage interfaces, in which the VIL is 0 volts and the VIH is 1.8 volts, and general LVTTL interfaces, in which the VIL is 0 volts and the VIH is 2.8 volts. The conventional N differential amplification type input buffer shown in FIG. 1 and the conventional P differential amplification type input buffer shown in FIG. 2 do not simultaneously support the low voltage interface of 1.8 volts and the LVTTL interface of 2.8 volts. Therefore, to simultaneously support the low voltage interface and the LVTTL and SSTL interfaces, self-biased differential amplification type input buffers were introduced. A representative self-biased differential amplification type input buffer is described by M. Bazes [Two Novel Fully Complementary Self-Biased CMOS Differential Amplifiers, IEEE Journal of Solid-State Circuits, Vol. 26, pp. 165–169, Feb. 1991]. Also, the improved self-biased differential amplification type input buffer as shown in FIG. 3 is described by Yasuhiro Takai and Mamoru Fujita [A 250 Mbps/pin, 1 Gb Double Data Rate SDRAM with a Bidirectional Delay and an Inter-bank shared Redundancy Scheme, ISSCC Digest of Technical Papers, Feb. 1999].

In the self-biased differential amplification type input buffer shown in FIG. 3, transconductance gain gm decreases slightly when a reference voltage VREF decreases. Accordingly, low voltage interface characteristics deteriorate, and the operating speed of the input buffer decreases.

SUMMARY OF THE INVENTION

To solve the above problem, an embodiment of the present invention provides an input buffer circuit that supports both a low voltage interface and a low voltage transistor-transistor logic (LVTTL) interface and operates at high speed.

One particular embodiment of the invention is an input buffer circuit including a differential amplification circuit, a current controlling circuit, and a swing width control circuit. The differential amplification circuit generates an internal self bias signal and an output signal, based on a voltage difference between a reference voltage and an input signal. The current controlling circuit responds to the internal self bias signal, supplies current to the differential amplification circuit, and sinks current from the differential amplification circuit to maintain the internal self bias signal at substantially uniform level. The swing width control circuit responds to an inverted signal generated from the output signal and limits the voltage swing of the output signal.

The swing width control circuit preferably includes an NMOS transistor and a PMOS transistor. The NMOS transistor is between an output node of the differential amplification circuit, from which the output signal is output, and a first node of the current control circuit. The NMOS transistor responds to the inverted signal. The PMOS transistor is between the output node of the differential amplification circuit and a second node of the current control circuit. The PMOS transistor also responds to the inverted signal.

The current control circuit preferably comprises a current source and/or a current sink. The current source is between a supply voltage terminal and the differential amplification circuit and supplies current to the differential amplification circuit in response to the internal self bias signal. The current sink is between the differential amplification circuit and a ground voltage terminal and sinks current from the differential amplification circuit in response to the internal self bias signal. Preferably, the current source is a PMOS transistor, and the current sink is an NMOS transistor.

According to an exemplary embodiment, the differential amplification circuit includes a self biased differential amplifier including first through fourth PMOS transistors and first through fourth NMOS transistors. The first PMOS transistor is between the first node of the current control circuit and an internal node from which the internal self bias signal is output and is gated by the reference voltage. The second PMOS transistor is between the first node and the internal node and is gated by the internal self bias signal. The third PMOS transistor is between the first node and an output node from which the output signal is output and is gated by the internal self bias signal. The fourth PMOS transistor is between the first node and the output node and is gated by the input signal. The first NMOS transistor is between the second node of the current control circuit and the internal node and is gated by the reference voltage. The second NMOS transistor is between the second node and the internal node and is gated by the internal self bias signal. The third NMOS transistor is between the second node and the output node and is gated by the internal self bias signal. The fourth NMOS transistor is between the second node and the output node and is gated by the input signal.

According to another embodiment, the differential amplification circuit includes a self biased latch type differential amplifier, which includes a positive feedback loop in the form of a latch. More particularly, the self biased latch type differential amplifier include first through fifth PMOS transistors and first through fifth NMOS transistors. The first PMOS transistor is between the first node of the current control circuit and an internal node from which the internal self bias signal is output and is gated by the reference voltage. The second PMOS transistor is between the first node and the internal node and is gated by the output signal. The third PMOS transistor is gated by the internal self bias signal and is between the first node and an output node from which the output signal is output. The fourth PMOS transistor is between the first node and the output node and is gated by the input signal. The fifth PMOS transistor has a source connected to the first node and a gate and a drain commonly connected to the internal node. The first NMOS transistor is between the second node of the current control circuit and the internal node and is gated by the reference voltage. The second NMOS transistor is between the second node and the internal node and is gated by the output signal. The third NMOS transistor is between the second node and the output node and is gated by the internal self bias signal. The fourth NMOS transistor is between the second node and the output node and is gated by the input signal. The fifth NMOS transistor has a gate and a drain commonly connected to the internal node and a source connected to the second node.

BRIEF DESCRIPTION OF THE DRAWINGS

The above aspects and advantages of the present invention will become more apparent by describing in detail exemplary embodiments thereof with reference to the attached drawings in which.

DETAILED DESCRIPTION

Figure 1:
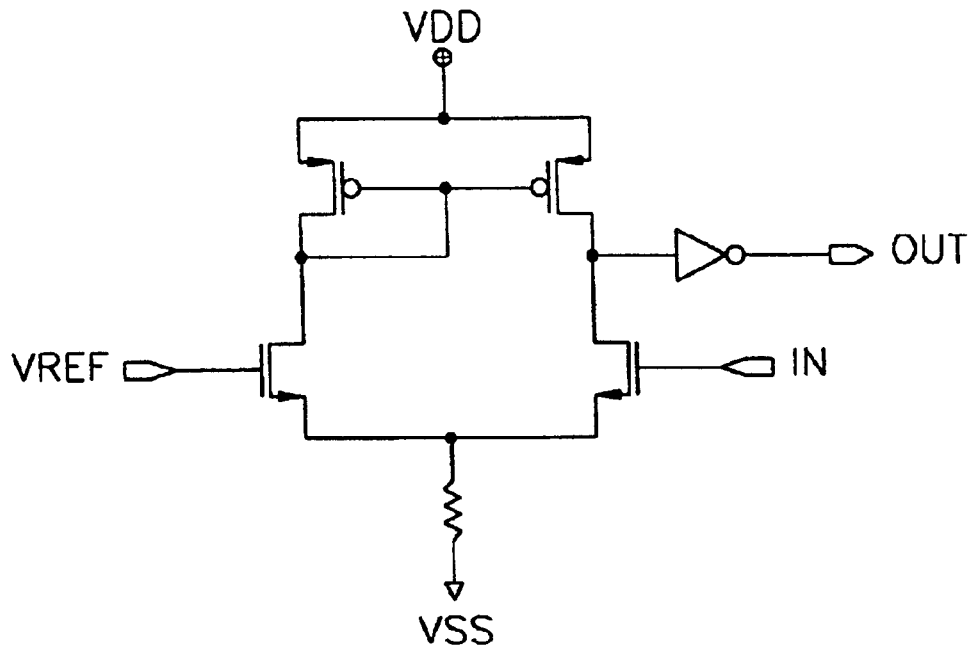
FIG. 1 is a circuit diagram of a conventional N differential amplification type input buffer.

The present invention is described more fully below with reference to the accompanying drawings, in which exemplary embodiments of the invention are shown. The same reference numerals in different drawings represent the same or similar elements.

Figure 4:
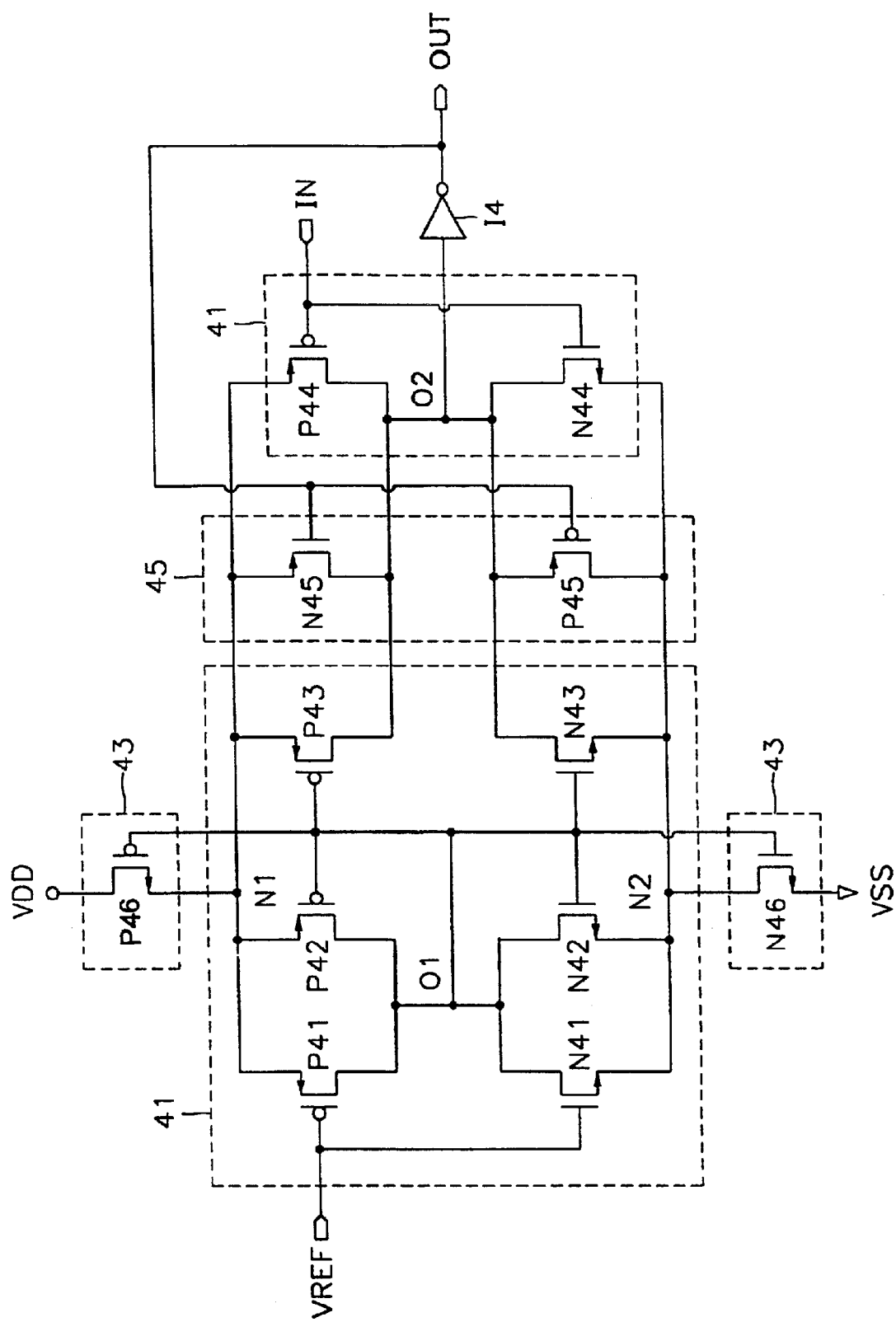
FIG. 4 is a circuit diagram of an input buffer circuit according to a first embodiment of the present invention.

FIG. 4 shows an input buffer circuit according to a first embodiment of the present invention. The input buffer circuit includes a differential amplification circuit 41, a current control circuit 43, and a swing width control circuit 45. The input buffer circuit, in which a rail-to-rail common mode input voltage is improved, has a self bias scheme.

The differential amplification circuit 41, which is a self-biased differential amplification circuit, is connected between a first node N1 and a second node N2. The differential amplification circuit 41 provides an internal self-biased signal at an internal node O1 and provides an output signal to an output node O2, based on a voltage difference between a reference voltage VREF and an input signal IN.

The differential amplification circuit 41 has a form in which a P-type differential amplifier and an N-type differential amplifier are mixed. The differential amplification circuit 41 includes first through fourth PMOS transistors P41, P42, P43, and P44 and first through fourth NMOS transistors N41, N42, N43, and N44. The first PMOS transistor P41 is between the first node N1 and the internal node O1 and is gated by the reference voltage VREF. The second PMOS transistor P42 is connected in parallel with the first PMOS transistor P41 between the first node N1 and the internal node O1 and is gated by a signal from the internal node O1, that is, the self bias signal. The third PMOS transistor P43 is between the first node N1 and the output node O2 and is gated by the self-bias signal from the internal node O1. The fourth PMOS transistor P44 is connected in parallel with the third PMOS transistor P43 between the first node N1 and the output node O2 and is gated by the input signal IN.

The first NMOS transistor N41 is between the second node N2 and the internal node O1 and is gated by the reference voltage VREF. The second NMOS transistor N42 is connected in parallel with the first NMOS transistor N41 between the second node N2 and the internal node O1 and is gated by the self bias signal. The third NMOS transistor N43 is between the second node N2 and the output node O2 and is gated by the self bias signal. The fourth NMOS transistor N44 is connected in parallel with the third NMOS transistor N43 between the second node N2 and the output node O2 and is gated by the input signal IN.

The current control circuit 43 supplies current to the differential amplification circuit 41 and sinks current from the differential amplification circuit 41 in response to the self bias signal and thereby maintains the self bias signal from the internal node O1 at a substantially uniform voltage level. The current control circuit 43 includes a current source, which is a PMOS transistor P46, and a current sink, which is an NMOS transistor N46. The PMOS transistor P46, which is between a supply voltage terminal VDD and the first node N1, responds to the self bias signal applied to the gate thereof and supplies current to the differential amplification circuit 41. The NMOS transistor N46, which is between the second node N2 and a ground voltage terminal VSS, responds to the self bias signal applied to the gate thereof and sinks current from the differential amplification circuit 41.

As mentioned above, in the input buffer circuit according to the embodiment of FIG. 4, the self bias signal from the internal node O1 is for tracking a common mode input voltage from the differential amplification circuit 41 and for controlling the current through the current source P46 and the current sink N46. Accordingly, the voltage level of the self bias signal from the internal node O1 remains substantially uniform. Therefore, in the input buffer circuit according to the embodiment of FIG. 4, the entire transconductance gain gm of the differential amplification circuit 41 remains substantially uniform regardless of changes in the reference voltage VREF, since the voltage level of the self bias signal remains substantially uniform. As a result, a low voltage interface characteristic is improved.

The swing width control circuit 45 limits the voltage swing of the output signal of the differential amplification circuit 41. An output signal OUT, which inverter I4 generates from the signal output from the output node O2 of the differential amplification circuit 41, controls the swing width control circuit 45.

The swing width control circuit 45 includes an NMOS transistor N45 and a PMOS transistor P45. The NMOS transistor N45 is between the first node N1 and the output node O2 and responds to the output signal OUT of the inverter I4. The PMOS transistor P45 is between the output node O2 and the second node N2 and also responds to the output signal OUT of the inverter I4. Alternatively, the NMOS transistor N45 can be directly connected between the supply voltage terminal VDD and the output node O2, and the PMOS transistor P45 can be directly connected between the output node O2 and the ground voltage terminal VSS. When the voltage on the node O2 is low, the output signal OUT is high, and the NMOS transistor N45 pulls up the voltage on the node O2 to prevent the voltage of the output node O2 from decreasing excessively. Similarly, the PMOS transistor P45 prevents the voltage level of the output node O2 from excessively increasing. Namely, the NMOS transistor N45 and the PMOS transistor P45 prevent the voltage swing of the signal from the output node O2 from becoming excessively large. Therefore, in the input buffer circuit according to the embodiment of FIG. 4, since the swing width control circuit 45 prevents the excessively large swings in the signal from the output node O2, skew is reduced, and the operating speed of the input buffer can be increased.

Figure 5:
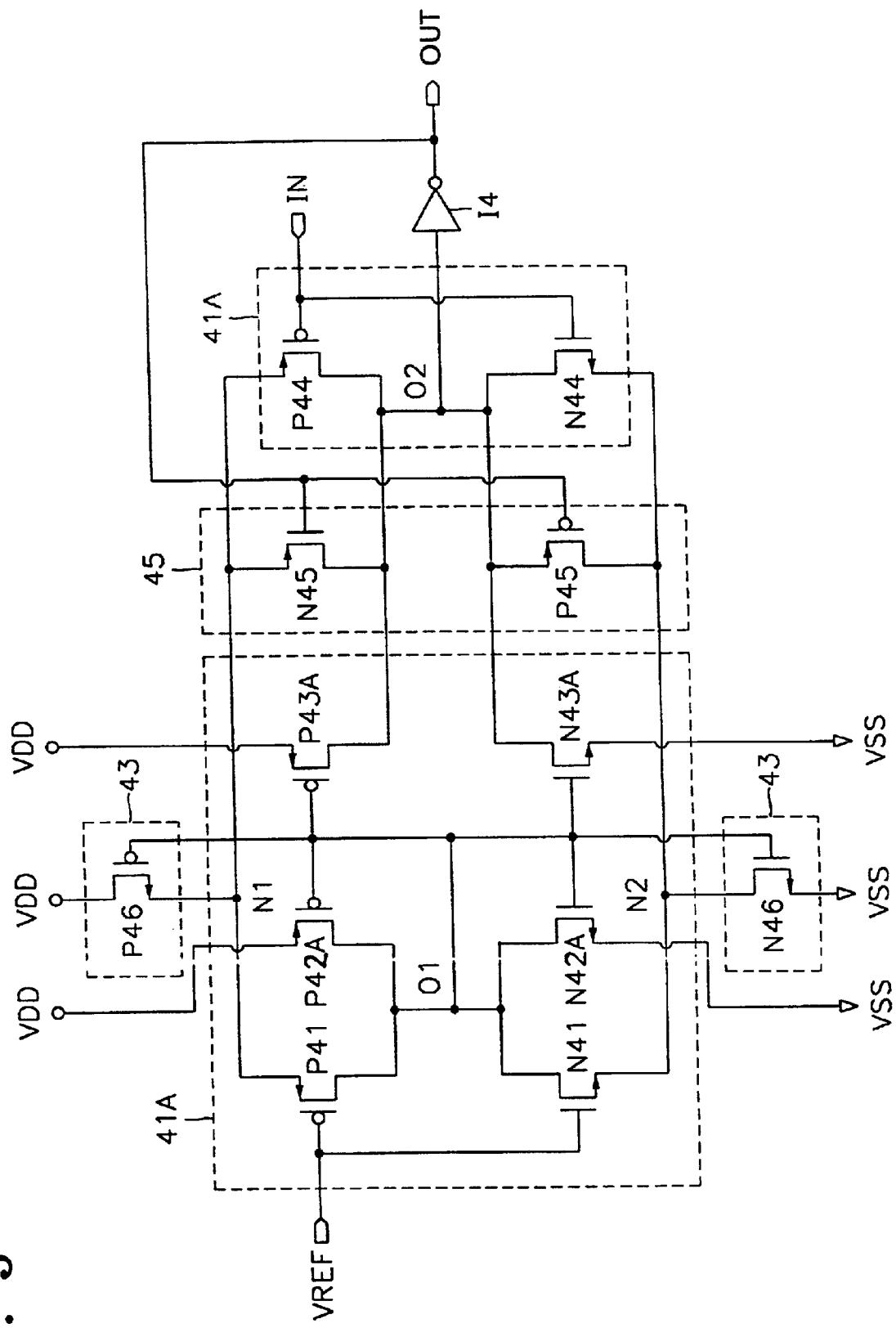
FIG. 5 is a circuit diagram of an input buffer circuit according to a second embodiment of the present invention.

FIG. 5 is a circuit diagram of an input buffer circuit according to a second embodiment of the present invention. The input buffer circuit of FIG. 5 differs from the input buffer circuit of FIG. 4 in that connections of a differential amplification circuit 41A in FIG. 5 differ from the connections of the differential amplification circuit 41 in FIG. 4.

In the differential amplification circuit 41A, the PMOS transistors P42A and P43A, which are gated by the self bias signal from the internal node O1, have sources directly connected to the supply voltage terminal VDD. Also, the NMOS transistors N42A and N43A, which are gated by the self bias signal, have sources directly connected to the ground voltage terminal VSS. Accordingly, more current flows through the PMOS transistors P42A and P43A and the NMOS transistors N42A and N43A, to thus increase the operating speed of the input buffer of FIG. 5.

Figure 6:
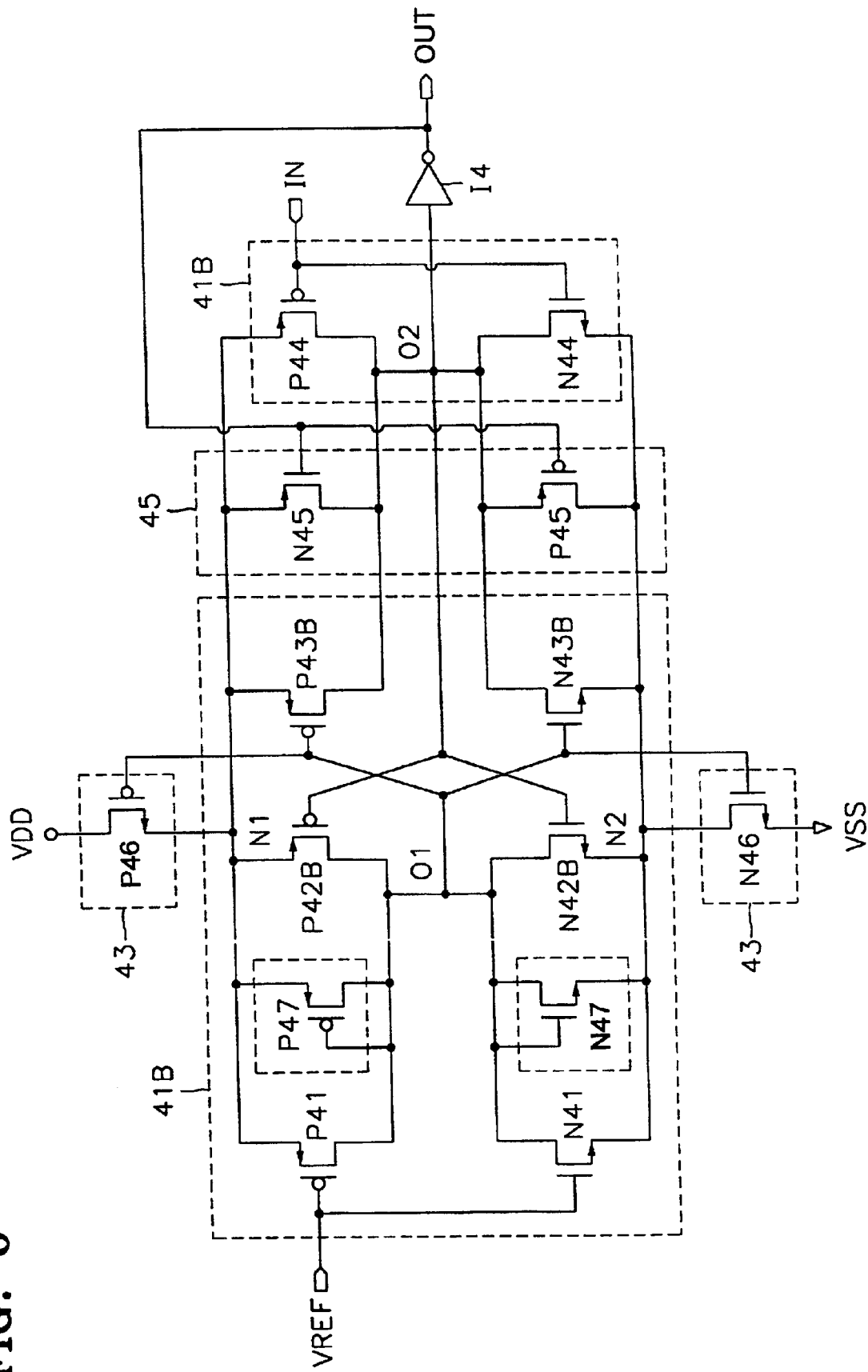
FIG. 6 is a circuit diagram of an input buffer circuit according to a third embodiment of the present invention.

FIG. 6 is a circuit diagram of an input buffer circuit according to a third embodiment of the present invention. The input buffer circuit of FIG. 6 differs from the input buffer circuit of FIG. 4 in that the structure of a differential amplification circuit 41B of FIG. 6 differs from the structure of the differential amplification circuit 41 of FIG. 4. The differential amplification circuit 41B is a self-biased latch-type differential amplification circuit and includes a positive feedback loop in the form of a latch. The differential amplification circuit 41B is connected between the first node N1 and the second node N2. The differential amplification circuit 41B provides the self bias signal at the internal node O1 and provides the output signal at the output node O2, based on the voltage difference between the reference voltage VREF and the input signal IN.

The differential amplification circuit 41B mixes aspects of a P latch type differential amplifier and an N latch type differential amplifier. The differential amplification circuit 41B includes first through fourth PMOS transistors P41, P42B, P43B, and P44 and first through fourth NMOS transistors N41, N42B, N43B, and N44. The first and fourth PMOS transistors P41 and P44 and the first and fourth NMOS transistors N41 and N44 have the same respective connections as those of the first and fourth PMOS transistors P41 and P44 and the first and fourth NMOS transistors N41 and N44 in FIG. 4. The second PMOS transistor P42B is between the first node N1 and the internal node O1 and is gated by the signal output from the output node O2. The third PMOS transistor P43B is between the first node N1 and the output node O2 and is gated by the self bias signal output from the internal node O1. The second NMOS transistor N42B is between the second node N2 and the internal node O1 and is gated by the signal output from the output node O2. The third NMOS transistor N43B is between the second node N2 and the output node O2 and is gated by the self bias signal. Accordingly, in the differential amplification circuit 41B, the second and third PMOS transistors P42B and P43B and the second and third NMOS transistors N42B and N43B form the positive feedback loop in the form of the latch.

The differential amplification circuit 41B further includes a fifth PMOS transistor P47 connected to form a diode, and a fifth NMOS transistor N47 connected to form a diode. The diode-connected transistors P47 and N47 reduce loop gain, since otherwise a bias point may be latched by the positive feedback loop gain. The fifth PMOS transistor P47 has a source connected to the first node N1 and a gate and a drain commonly connected to the internal node O1. The fifth NMOS transistor N47 has a gate and a drain commonly connected to the internal node O1 and a source connected to the second node N2. The fifth PMOS transistor P47 turns on and supplies current to the internal node O1 when the voltage of the internal node O1 is less than or equal to a predetermined voltage and thereby prevents the voltage of the internal node O1 from excessively decreasing. More specifically, when a voltage Vgs between the gate and the source of the fifth PMOS transistor P47 becomes higher than the threshold voltage Vtp of the fifth PMOS transistor P47, the fifth PMOS transistor P47 turns on and supplies current to the internal node O1. Similarly, the fifth NMOS transistor N47 turns on and sinks current from the internal node O1 when the voltage of the internal node O1 is greater than or equal to the predetermined voltage and thereby prevents the voltage of the internal node O1 from excessively increasing. More specifically, when the gate-to-source voltage Vgs of the fifth NMOS transistor N47 is higher than the threshold voltage Vtn of the fifth NMOS transistor N47, the fifth NMOS transistor N47 turns on and sinks the current of the internal node O1. Therefore, the fifth PMOS transistor P47 and the fifth NMOS transistor N47 perform self-biasing and stably control loop gain.

Hereinafter, the operation of the input buffer circuit of FIG. 6 is described in more detail. When the reference voltage VREF is greater than or equal to a predetermined voltage, the P latch type differential amplifier and the N latch type differential amplifier of the differential amplification circuit 41B operate. Accordingly, the entire transconductance gain gm of the differential amplification circuit 41B becomes 2gm0, where gm0 is the transconductance gain of the P or N latch type differential amplifier alone. When the reference voltage VREF is low, that is, lower than about 0.9 volts, only the P latch type differential amplifier of the differential amplification circuit 41B operates. Accordingly, the entire transconductance gain gm of the differential amplification circuit 41B is the sum of the gain of a P type source-coupled pair and the gain of a positive feedback NMOS loop. When the gain of the positive feedback NMOS loop is activated, the entire transconductance gain gm of the differential amplification circuit 41B can be 2gm0. Therefore, in the differential amplification circuit 41B, the entire transconductance gain gm can be maintained to be substantially uniform regardless of the change in the reference voltage VREF.

The self bias signal from the internal node O1 is used not only for the differential amplification circuit 41B but also for controlling the current of the current source P46 and the current sink N46, as in the first embodiment shown in FIG. 4. Accordingly, the voltage level of the self bias signal from the internal node O1 remains substantially uniform.

Therefore, in the input buffer circuit of FIG. 6, since the voltage level of the self bias signal remains substantially uniform, the entire transconductance gain gm of the differential amplification circuit 41B is substantially uniform regardless of changes in the reference voltage VREF. As a result, the low voltage interface characteristic is improved.

The input buffer circuit of FIG. 6 also includes the swing width control circuit 45 that prevents the voltage swing of the signal output from the output node O2, from becoming excessively large. Accordingly, skew is reduced to thus improve the operating speed of the input buffer. More generally, the swing width control circuit 45 of the first through third embodiments can be connected to the output node of a general differential amplification circuit, instead of the self biased differential amplification circuits illustrated. Even with a general differential amplification circuit, the swing width control circuit 45 reduces skew to increase operating speed of the input buffer.

Figure 2:
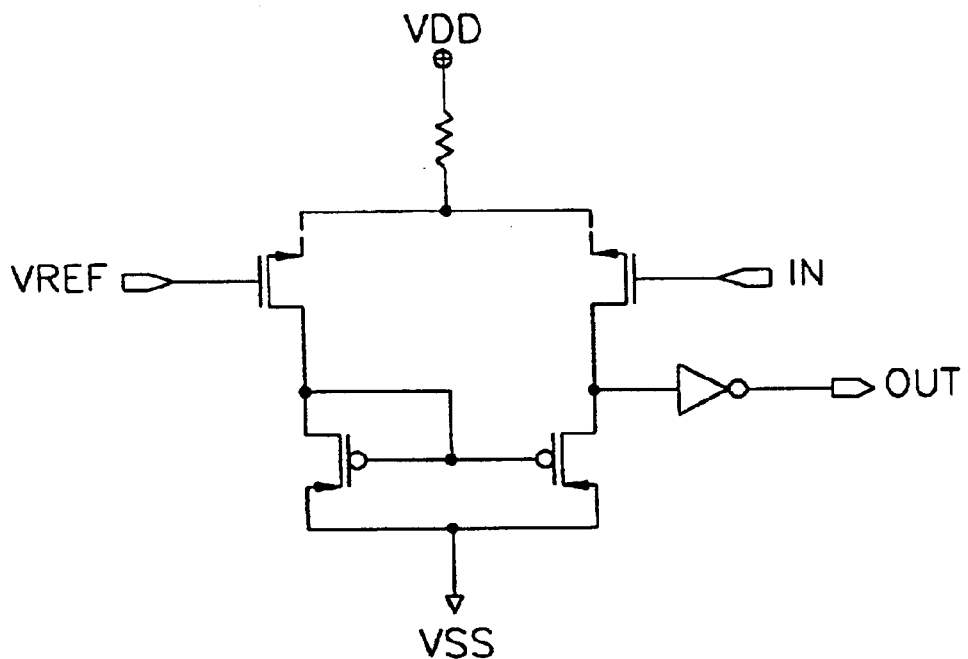
FIG. 2 is a circuit diagram of a conventional P differential amplification type input buffer.
Figure 3:
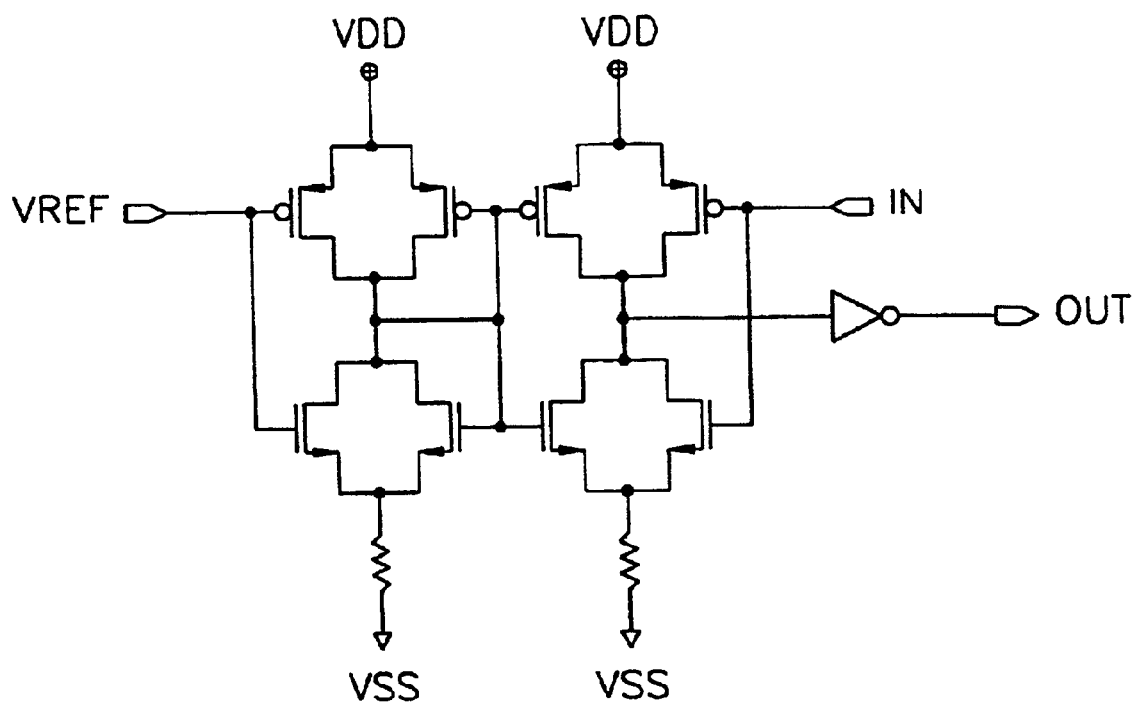
FIG. 3 is a circuit diagram of a conventional self-biased differential amplification type input buffer.
Figure 7A:
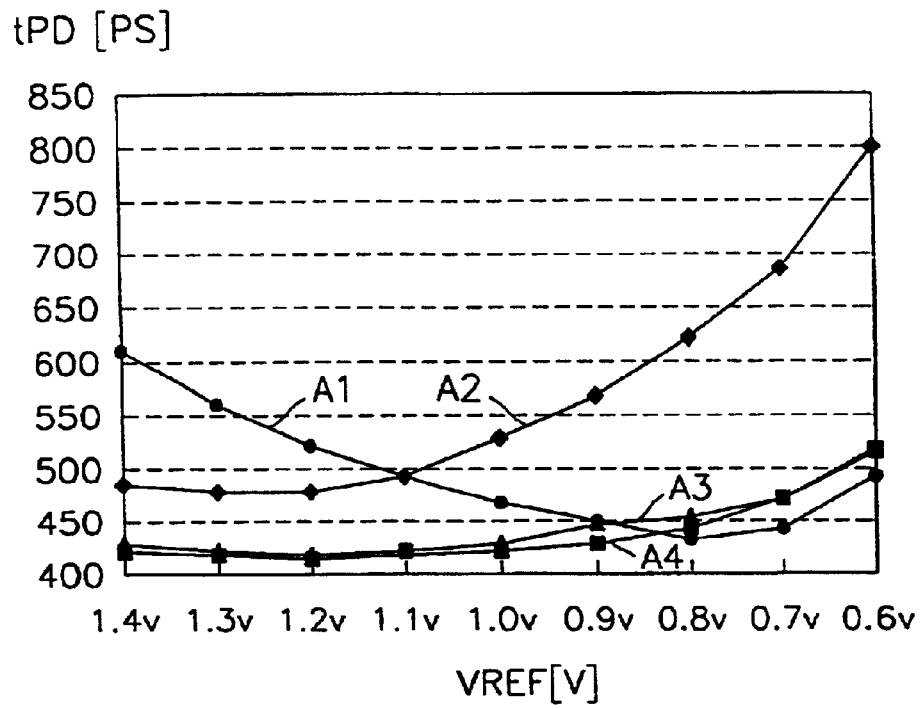
FIG. 7A is a graph showing the results of a simulation of the dependence of an average propagation delay time tPD on changes in a reference voltage VREF when a ground voltage VSS is 0 volts.

FIGS. 7A through 9 are graphs illustrating the results of simulations of the low voltage interface performances of the conventional input buffers shown in FIGS. 1 through 3 and the low voltage interface performance of the input buffer according to the embodiment of the present invention shown in FIG. 4. Under the simulation conditions, the supply voltage VDD was 2.8 volts, the temperature was 100° C., and the input signal IN was VREF±0.35 volts. Also, to observe immunity to ground noise, simulations were performed with respect to a ground voltage VSS of 0 volts and 0.3 volts. FIG. 7A shows the result of a simulation of the dependence of an average propagation delay time tPD on changes in the reference voltage VREF when the ground voltage VSS is 0 volts. In FIG. 7A, A1 denotes the average propagation delay time of the P differential amplification type input buffer shown in FIG. 2. A2 denotes the average propagation delay time of the N differential amplification type input buffer shown in FIG. 1. A3 denotes the average propagation delay time of the self biased differential amplification type input buffer shown in FIG. 3. A4 denotes the average propagation delay time of the input buffer according to the embodiment of the present invention shown in FIG. 4.

Figure 7B:
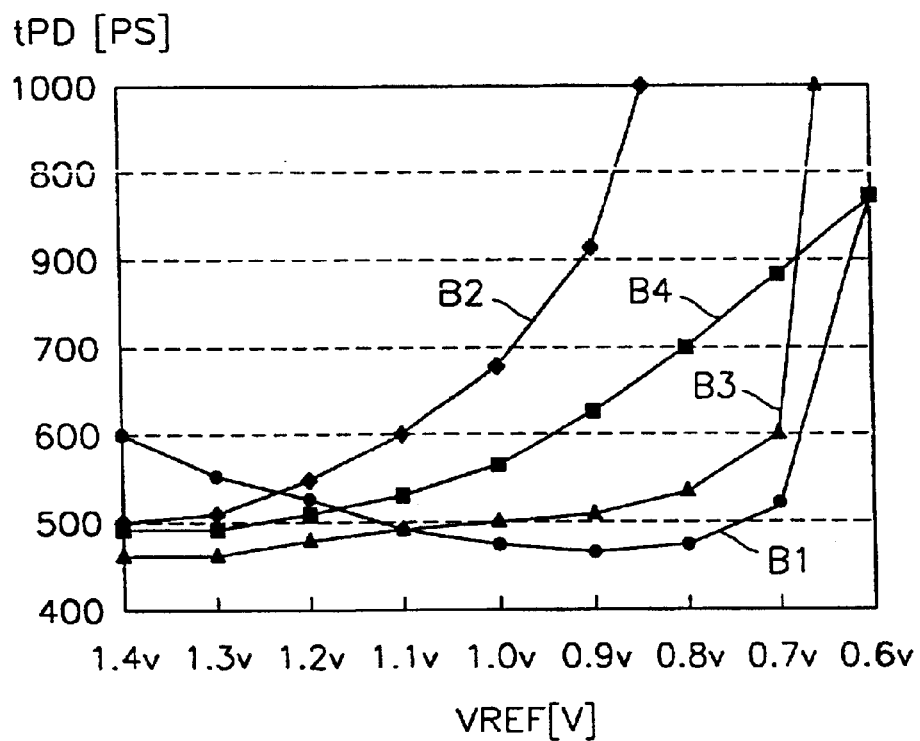
FIG. 7B is a graph showing the results of a simulation of the dependence of the average propagation delay time tPD on changes in the reference voltage VREF when the ground voltage VSS is 0.3 volts.

FIG. 7B shows the result of a simulation of the dependence of the average propagation delay time tPD on changes in the reference voltage VREF when the ground voltage VSS is 0.3 volts. Here, B1 represents the average propagation delay time of the P differential amplification type input buffer shown in FIG. 2. B2 denotes the average propagation delay time of the N differential amplification type input buffer shown in FIG. 1. B3 denotes the average propagation delay time of the self biased differential amplification type input buffer shown in FIG. 3. B4 denotes the average propagation delay time of the input buffer according to the embodiment of the present invention shown in FIG. 4.

Referring to FIG. 7B, when the ground voltage VSS is 0.3 volts, the average propagation delay time B2 of the N differential amplification type input buffer rapidly increases when the reference voltage VREF is less than about 1.0 volt, and the average propagation delay time B1 of the P differential amplification type input buffer rapidly increases when the reference voltage VREF is less than about 0.7 volts. Also, the average propagation delay time B3 of the self biased differential amplification type input buffer shown in FIG. 3 rapidly increases when the reference voltage VREF is less than about 0.7 volts. Namely, considering the average propagation delay time, the N differential amplification type input buffer shown in FIG. 1, the P differential amplification type input buffer shown in FIG. 2, and the self biased differential amplification type input buffer shown in FIG. 3 are vulnerable to ground noise and are not suitable for the low voltage interface. The average propagation delay time B4 of the input buffer according to the present invention shown in FIG. 4 is substantially uniform regardless of changes in the reference voltage VREF when the ground voltage VSS is 0.3 volts. Namely, considering the average propagation delay time, the input buffer according to the present invention shown in FIG. 4 is less vulnerable to ground noise and is suitable for a low voltage interface.

Referring to FIGS. 7A and 7B, the average propagation delay times A4 and B4 of the input buffer according to the present invention shown in FIG. 4 are similar to the average propagation delay times A3 and B3 of the self biased differential amplification type input buffer shown in FIG. 3.

Figure 8A:
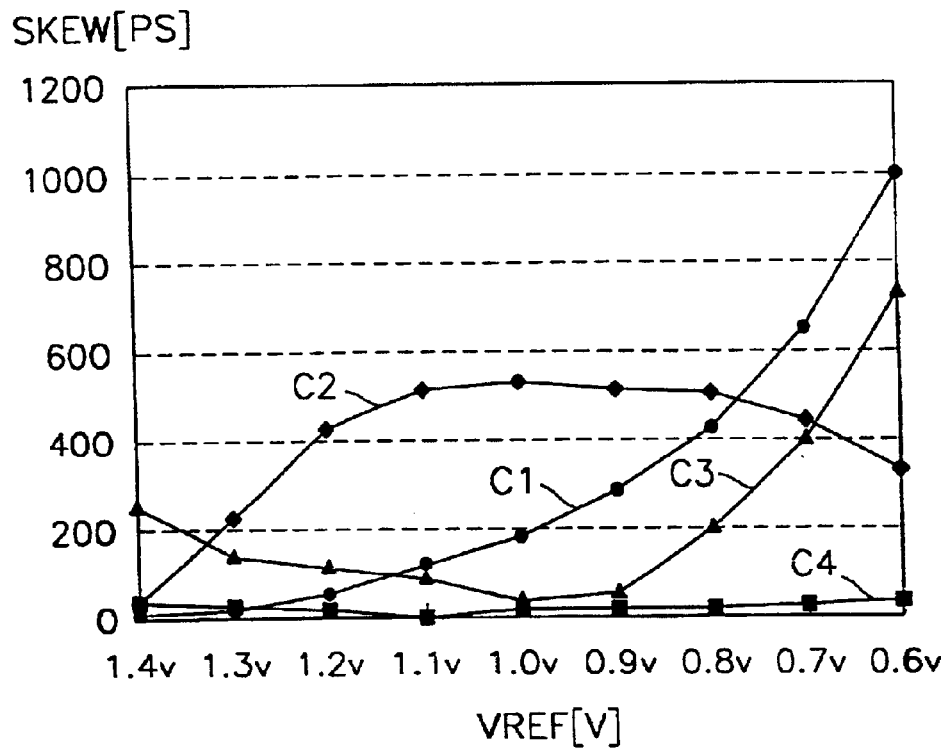
FIG. 8A is a graph showing the results of a simulation of the dependence of skew on changes in the reference voltage VREF when the ground voltage VSS is 0 volts.

FIG. 8A shows the result of a simulation of the dependence of skew on changes in the reference voltage VREF when the ground voltage VSS is 0 volts. Here, C1 denotes the skew of the P differential amplification type input buffer shown in FIG. 2. C2 denotes the skew of the N differential amplification type input buffer shown in FIG. 1. C3 denotes the skew of the self biased differential amplification type input buffer shown in FIG. 3. C4 denotes the skew of the input buffer according to the embodiment of the present invention shown in FIG. 4.

Figure 8B:
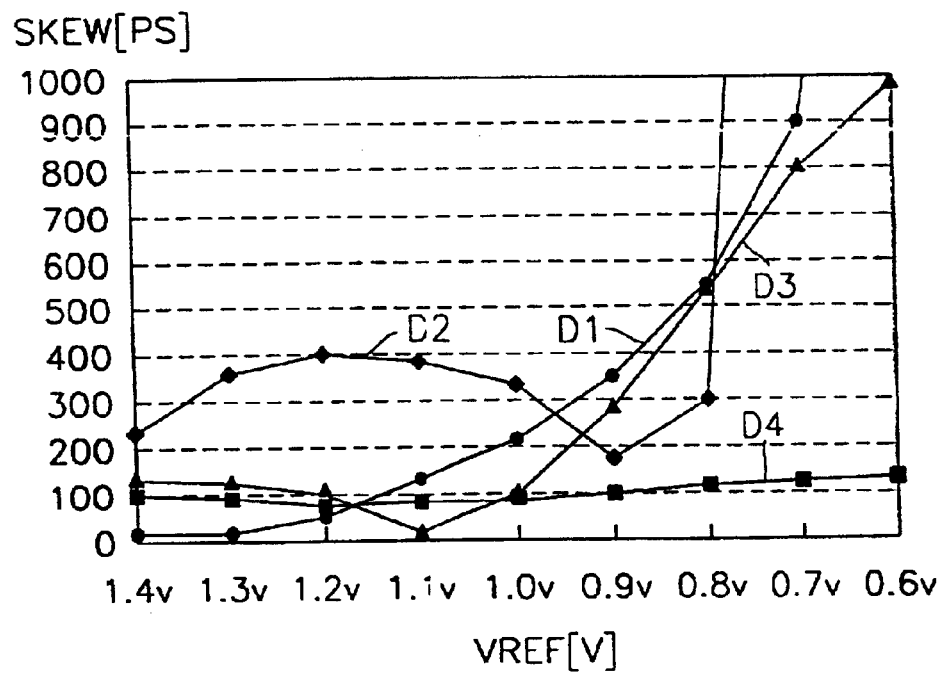
FIG. 8B is a graph showing the results of a simulation of the dependence of skew on changes in the reference voltage VREF when the ground voltage VSS is 0.3 volts.

FIG. 8A shows the result of a simulation of the dependence of skew on changes in the reference voltage VREF when the ground voltage VSS is 0.3 volts. Here, D1 denotes the skew of the P differential amplification type input buffer shown in FIG. 2. D2 denotes the skew of the N differential amplification type input buffer shown in FIG. 1. D3 denotes the skew of the self biased differential amplification type input buffer shown in FIG. 3. D4 denotes the skew of the input buffer according to the embodiment of the present invention shown in FIG. 4. Referring to FIGS. 8A and 8B, the skews C1 and D1 of the P differential amplification type input buffer shown in FIG. 2 and the skews C2 and D2 of the N differential amplification type input buffer shown in FIG. 1 are much larger than the skews C3 and D3 of the self biased differential amplification type input buffer shown in FIG. 3 and the skews C4 and D4 of the input buffer according to the embodiment of the present invention shown in FIG. 4. Referring to FIG. 8B, when the ground voltage VSS is 0.3 volts, the skew D1 of the P differential amplification type input buffer rapidly increases when the reference voltage VREF is less than about 0.9 volts and the skew D2 of the N differential amplification type input buffer rapidly increases when the reference voltage VREF is less than about 0.8 volts. Also, the skew D3 of the self biased differential amplification input buffer shown in FIG. 3 rapidly increases when the reference voltage VREF is less than about 0.9 volts. Namely, considering the skew, the N differential amplification type input buffer shown in FIG. 1, the P differential amplification input buffer shown in FIG. 2, and the self biased differential amplification type input buffer shown in FIG. 3 are vulnerable to changes in the ground voltage and are not suitable for the low voltage interface.

The skews C4 and D4 of the input buffer according to the present invention shown in FIG. 4 are substantially uniform regardless of changes in the reference voltage VREF. Namely, considering the skew, the input buffer according to the present invention shown in FIG. 4 is less vulnerable to changes in the ground voltage and is suitable for the low voltage interface. The skews C4 and D4 of the input buffer according to the present invention shown in FIG. 4 are also much smaller than the skews of the conventional input buffers shown in FIGS. 1 through 3.

Figure 9:
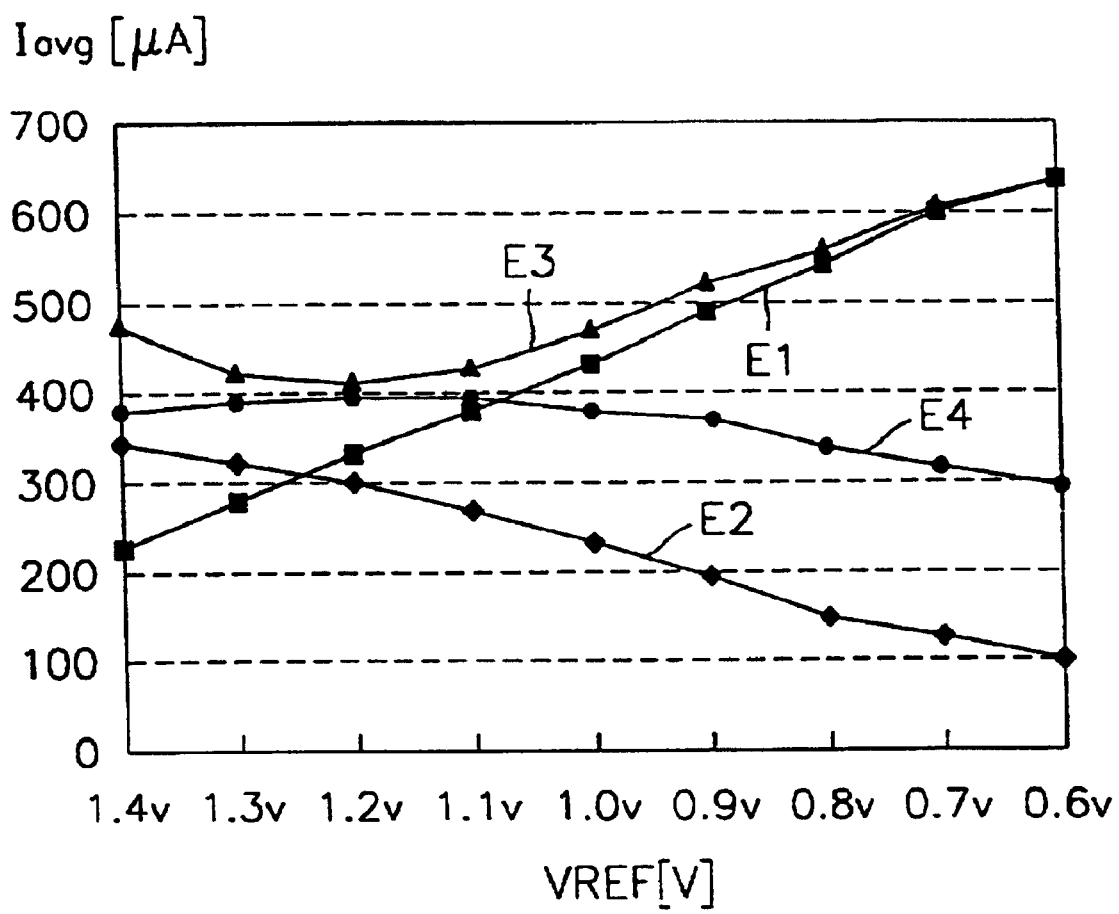
FIG. 9 is a graph showing the results of a simulation of the dependence of average current Iavg on changes in the reference voltage VREF.

FIG. 9 shows the result of a simulation of the dependence of average current Iavg on changes in the reference voltage VREF. In FIG. 9, E1 denotes the average current Iavg of the P differential amplification type input buffer shown in FIG. 2. E2 denotes the average current of the N differential amplification type input buffer shown in FIG. 1. E3 denotes the average current of the self biased differential amplification type input buffer shown in FIG. 3. E4 denotes the average current of the input buffer according to the embodiment of the present invention shown in FIG. 4. Referring to FIG. 9, the self biased differential amplification type input buffer shown in FIG. 3 consumes the largest amount of current.

In summary, the input buffer according to the embodiment of the present invention shown in FIG. 4 is less vulnerable to changes in the ground voltage and is suitable for the low voltage interface, considering the average propagation delay time and the skew. The average propagation delay time and the skew of the input buffer shown in FIG. 4 are less than the average propagation delay times and the skews of the conventional input buffers shown in FIGS. 1 through 3. Namely, the operating speed of the input buffer according to the present invention is higher than the operating speed of the conventional input buffers shown in FIGS. 1 through 3.

As mentioned above, the input buffer circuit according to the present invention can support both the low voltage interface and the general LVTTL interface and operates at high speed.

The drawings and specification illustrate and disclose typical exemplary embodiments of the invention, as examples and not limitations on the invention. Further, the specific terms employed herein are used in a generic and descriptive sense only and not for purposes of limitation, the scope of the invention being set forth in the following claims. Therefore, various changes in form and details may be made in the exemplary embodiments without departing from the spirit and scope of the invention as defined by the appended claims.

What is claimed is:

1. An input buffer circuit comprising:
   a first inverting switch connected to a first input voltage and outputting a self bias signal;
   a second inverting switch connected to a second input voltage and outputting an output signal;
   a gain control unit having a dual feedback loop for gain control responsive to the self bias signal and the output signal; and
   a current controlling circuit that supplies current to the first inverting switch, the second inverting switch and the gain control unit and sinks current from the first inverting switch, the second inverting switch and the gain control unit, the current controlling circuit responding to the self bias signal; and wherein
   the gain control unit includes,
   a first PMOS transistor having a source connected to a first node, a drain connected to the self bias signal and a gate connected to the output signal;
   a first NMOS transistor having a source connected to a second node, a drain connected to the self bias signal and a gate connected to the output signal;
   a second PMOS transistor having a source connected to the first node, a drain connected to the output signal and a gate connected to the self bias signal;
   a second NMOS transistor having a source connected to the second node, a drain connected to the output signal and a gate connected to the self bias signal and wherein the current controlling circuit comprises;
   a third PMOS transistor having a source connected to the first node, a drain connected to the gain control unit to supply current and a gate connected to the self bias signal; and
   a third NMOS transistor having a source connected to the second node, a drain connected to the gain control unit to sink current and a gate connected to the self bias signal.

2. An input buffer circuit comprising:
   a first inverting switch connected to a first input voltage and outputting a self bias signal;
   a second inverting switch connected to a second input voltage and outputting an output signal;
   a gain control unit having a dual feedback loop for gain control responsive to the self bias signal and the output signal; and
   a swing width control circuit connected to a feedback signal that is inverted by the output signal, the swing with control circuit including,
   an NMOS transistor having a source connected to the gain control unit, a drain connected to the gain control unit and a gate connected to the feedback signal; and
   a PMOS transistor having a source connected to the output signal, a drain connected to the gain control unit and a gate connected, to the feedback signal.

3. The input buffer circuit of claim 2, wherein the gain control unit comprises:
   a first PMOS transistor having a source connected to a first node, a drain connected to the self bias signal and a gate connected to the output signal;
   a first NMOS transistor having a source connected to a second node, a drain connected to the self bias signal and a gate connected to the output signal;
   a second PMOS transistor having a source connected to the first node, a drain connected to the output signal and a gate connected to the self bias signal; and
   a second NMOS transistor having a source connected to the second node, a drain connected to the output signal and a gate connected to the self bias signal.

4. The input buffer circuit of claim 3, wherein the gain control unit further comprises:
   a third PMOS transistor having a source connected to the first node, a gate and a drain connected to the self bias signal;
   a third NMOS transistor having a source connected to the second node, a gate and a drain connected to the self bias signal.

* * * * *